(12) United States Patent
Candler et al.

(10) Patent No.: US 11,070,215 B2
(45) Date of Patent: Jul. 20, 2021

(54) LOCKED LOOP CIRCUIT AND METHOD WITH DIGITALLY-CONTROLLED OSCILLATOR (DCO) GAIN NORMALIZATION

(71) Applicant: Movellus Circuits Incorporated, Ann Arbor, MI (US)

(72) Inventors: Frederick Christopher Candler, Toronto (CA); Jeffrey Fredenburg, Ann Arbor, MI (US)

(73) Assignee: Movellus Circuits, Inc., Ann Arbor, MI (US)

( * ) Notice: Subject to any disclaimer, the term of this patent is extended or adjusted under 35 U.S.C. 154(b) by 0 days.

(21) Appl. No.: 16/821,153

(22) Filed: Mar. 17, 2020

(65) Prior Publication Data

US 2020/0235746 A1    Jul. 23, 2020

Related U.S. Application Data

(63) Continuation-in-part of application No. 16/006,927, filed on Jun. 13, 2018, now Pat. No. 10,594,323.

(51) Int. Cl.
*H03L 7/099* (2006.01)
*H03L 7/191* (2006.01)
*H03L 7/093* (2006.01)

(52) U.S. Cl.
CPC ........... *H03L 7/0992* (2013.01); *H03L 7/093* (2013.01); *H03L 7/0994* (2013.01); *H03L 7/191* (2013.01)

(58) Field of Classification Search
CPC ..................................................... H03L 7/0992

USPC ........................................................... 331/18
See application file for complete search history.

(56) References Cited

U.S. PATENT DOCUMENTS

| | | | |
|---|---|---|---|
| 5,999,060 A | 12/1999 | Zuta | |
| 6,072,842 A * | 6/2000 | Janesch | H03L 7/0991 375/326 |
| 6,218,876 B1 | 4/2001 | Sung | |
| 6,275,553 B1 | 8/2001 | Esaki | |
| 6,424,192 B1 | 7/2002 | Lee | |
| 6,496,965 B1 | 12/2002 | van Ginneken | |
| 6,744,324 B1 | 6/2004 | Adams | |
| 6,826,247 B1 | 11/2004 | Elliott | |
| 7,216,249 B2 | 5/2007 | Fujiwara | |
| 8,117,576 B2 | 2/2012 | Mossawir | |
| 8,321,489 B2 | 11/2012 | Staszewski | |
| 8,427,205 B1 | 4/2013 | Nagaraj | |
| 8,791,734 B1 | 7/2014 | Hara | |
| 9,007,109 B2 * | 4/2015 | Ba | H03L 7/085 327/159 |
| 9,698,798 B1 | 7/2017 | Fredenburg | |

(Continued)

*Primary Examiner* — Joseph Chang
(74) *Attorney, Agent, or Firm* — Lance Kreisman; Peninsula Patent Group

(57) ABSTRACT

A method of operation in a locked-loop circuit. The locked-loop circuit includes a loop filter and a digitally-controlled oscillator (DCO). The loop filter includes a first input to receive a digital word representing a difference between a reference clock frequency and a DCO output frequency. The loop filter includes internal storage. The method includes selecting a desired DCO output frequency that is generated in response to a calibration DCO codeword. A start value is retrieved from the loop filter internal storage. The start value corresponds to the calibration DCO codeword. The locked-loop circuit is then started with the retrieved start value.

20 Claims, 4 Drawing Sheets

(56) References Cited

U.S. PATENT DOCUMENTS

| | | |
|---|---|---|
| 2005/0189972 A1 | 9/2005 | Foo |
| 2007/0085622 A1 | 4/2007 | Wallberg |
| 2010/0073048 A1* | 3/2010 | Ke ................... H03L 7/093 |
| | | 327/157 |
| 2010/0244971 A1 | 9/2010 | Wang |
| 2013/0120036 A1 | 5/2013 | Zhu |
| 2013/0300477 A1 | 11/2013 | Ueda |
| 2016/0036454 A1 | 2/2016 | Moehlmann |
| 2016/0204787 A1 | 7/2016 | Lotfy |
| 2017/0193136 A1 | 7/2017 | Prasad |
| 2020/0076439 A1* | 3/2020 | Weeks ............... H03L 7/0992 |

* cited by examiner

LOCKED LOOP CIRCUIT AND METHOD WITH DIGITALLY-CONTROLLED OSCILLATOR (DCO) GAIN NORMALIZATION

CROSS-REFERENCE TO RELATED APPLICATIONS

This application is a Continuation-In-Part that claims priority to U.S. application Ser. No. 16/006,927, filed Jun. 13, 2018, titled LOCKED LOOP CIRCUIT AND METHOD WITH DIGITALLY-CONTROLLED OSCILLATOR (DCO) GAIN NORMALIZATION, which is incorporated herein by reference in its entirety.

TECHNICAL FIELD

The disclosure herein relates to locked loop circuits, and more particularly digital locked-loop circuits with adjustable parameters in response to changing environmental conditions.

BACKGROUND

Locked loop circuits, such as phase-locked loops, typically generate timing signals relative to an input reference signal. The locked loop circuitry adjusts the frequency of an output signal based on frequency and/or phase differences between the reference signal and the output signal. Based on any such difference, the frequency and/or phase of the output signal is increased or decreased accordingly. Phase-locked loops are used in a wide range of electronics, such as radios, telecommunication circuits, wireless and mobile devices, computers, and other devices.

Digital phase-locked loops often employ a digitally-controlled oscillator (DCO) that converts an input digital word received from a loop filter into a periodic signal output at a given frequency. Functionally, conventional DCO circuits generate the periodic output using a digital-to-analog frequency mapping curve that acts as a function applied to the input digital word from the loop filter. Under various operating conditions, such as those involving process, voltage or temperature (PVT) variations, the frequency mapping curve may exhibit gain variation referred to as DCO gain variation, which in turn may introduce error in the frequency and/or phase of the output signal.

Accordingly, what is needed are methods, systems and associated apparatus that allow for compensating for DCO gain variations in a straightforward, efficient and predictable manner.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of locked-loop circuits and methods are provided. In one embodiment, a method of operation in a locked-loop circuit. The locked-loop circuit includes a loop filter and a digitally-controlled oscillator (DCO). The loop filter includes a first input to receive a digital word representing a difference between a reference clock frequency and a DCO output frequency. The loop filter includes internal storage. The method includes selecting a desired DCO output frequency that is generated in response to a calibration DCO codeword. A start value is retrieved from the loop filter internal storage. The start value corresponds to the calibration DCO codeword. The locked-loop circuit is then started with the retrieved start value.

Figure 1:
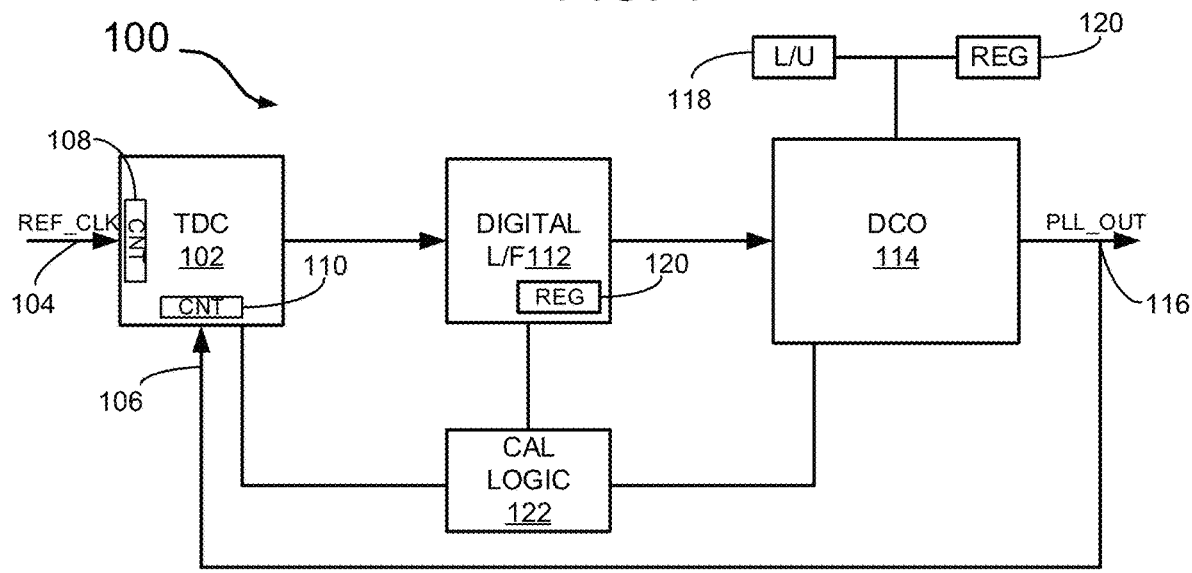
FIG. 1 illustrates one embodiment of a digital phase-locked loop (PLL).

FIG. 1 illustrates one embodiment of a digital phase-locked loop (PLL), generally designated 100, that may be used to generate a desired output timing signal, such as a clock signal. The PLL includes a time-to-digital converter (TDC) 102 that receives as inputs a periodic reference clock signal REF_CLK, at 104, and a PLL clock output signal PLL_OUT, at 106. Each of the clock input signals drive counter circuits 108, 110, which generate digital count values corresponding to the input signal frequencies. The TDC further includes a phase detector that includes comparison circuitry (not shown) to compare the frequency counts of the two counters, and generate a difference count value in the form of a multi-bit digital word. The difference count and resulting multi-bit digital word thus represents a phase difference between the reference clock signal and the PLL clock output signal.

With continued reference to FIG. 1, a digital loop filter 112 receives the output digital word from the TDC 102, representing the phase difference between the TDC input clocks, and employs processing circuitry to apply one or more digital filtering techniques to smooth the multi-bit digital word. The processing circuitry may include register circuitry to store values of integral Ki and proportional Kp gain constants employed in the digital filtering technique. Some embodiments may employ additional constants to extend the filtering to higher orders. Additional accumulators and/or internal storage in the form of temporary registers 113 may be employed to store retrievable settings of start codeword values, phase values, or quiescent state values for internal loop filter control values. For one embodiment, explained more fully below, a scaling factor may be applied to one or both of the integral Ki and proportional Kp gain constants. The output of the digital loop filter is then fed to a digitally-controlled oscillator (DCO) 114.

Further referring to FIG. 1, the DCO 114 generally serves as a digital-to-frequency converter, receiving the smoothed digital output word from the loop filter 112, and applying one of a set of predefined DCO codewords that match closest to the received digital output word from the loop filter. The applied DCO codeword corresponds to a desired output frequency. The DCO uses the codeword to control the oscillator which in turn generates a frequency that corresponds to the codeword in an approximate sense. A periodic output signal is produced by, for example, a crystal oscillator, based on the value of the DCO codeword, and provided to an output node, at 116. The ratio between a change in frequency resulting from a change in the DCO codeword is referred to herein as DCO gain. Ways to determine and normalize DCO gain are explained below. The output timing signal PLL_OUT is then fed back to the TDC 102 to complete a control loop, and may also be distributed to other circuits needing a clock signal. The local storage may also provide initial settings for DCO operation as more fully described below.

With continued reference to FIG. 1, for one embodiment, the PLL 100 employs calibration circuitry 122 in the form of logic to manage DCO gain normalization operations, and to provide beneficial frequency and phase initialization operations, each of which are more fully described below. The calibration circuitry is generally coupled to control the normalization/initialization operations applied to the TDC, loop filter and DCO. In one embodiment, the calibration circuitry may employ state machine hardware such as a time-multiplexed multiplier and divider circuit to perform various arithmetic operations described herein. For some embodiments, the state machine hardware may be incorporated in any of the PLL circuit modules, such as the loop filter, or distributed throughout the various modules.

Figure 2:
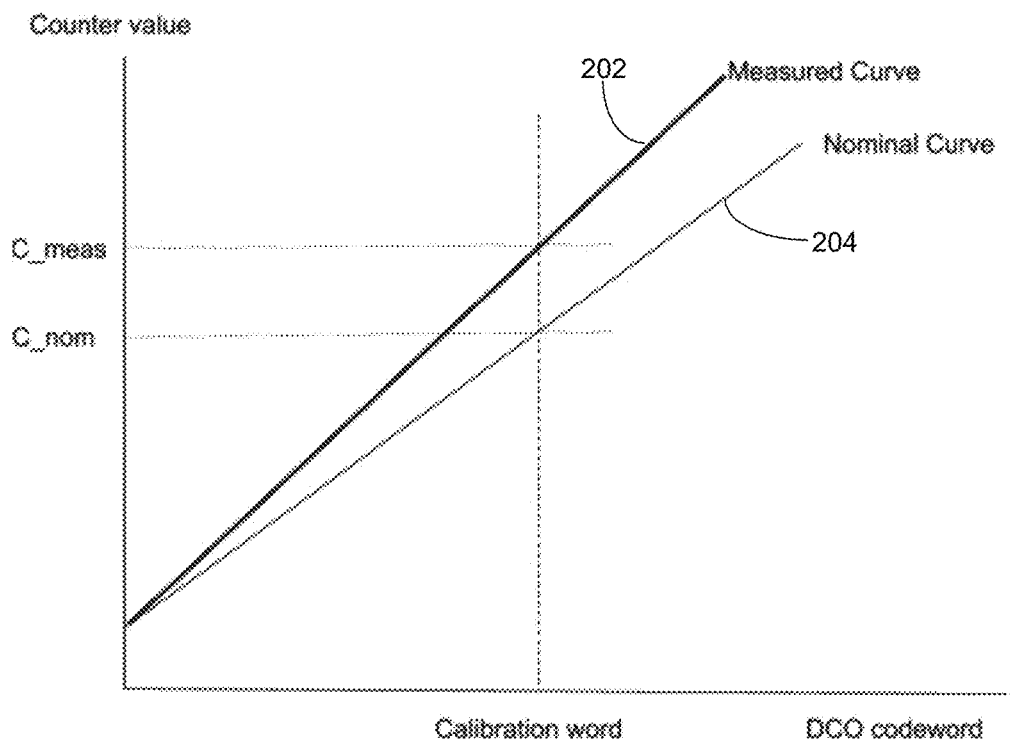
FIG. 2 illustrates a graph plotting a measured DCO gain versus a nominal DCO gain.

In some situations, an expected frequency resulting from application of the selected DCO codeword differs significantly from an actual frequency. This is often the case for physical implementations of the PLL on an actual semiconductor chip. FIG. 2 illustrates respective nominal and measured curves, at 202 and 204, that plot digital count values (y-axis), against selected DCO codeword values (x-axis). The nominal curve 204 plots an expected frequency (in terms of count value) versus the DCO codeword. The slope of the nominal curve 204 thus represents a nominal DCO gain, representing a change in count value (corresponding to output frequency) for each least-significant-bit (LSB) change in the DCO codeword. Similarly, the measured curve 202 represents a measured gain, or change in count value for each incremental change in the DCO codeword (for example, where a single bit change in the codeword leads to a change in frequency). In order to compensate for the change in measured versus expected DCO operation due to, for example, process-voltage-temperature (PVT) effects, a DCO gain normalization process or calibration may be performed, as explained below.

Generally, for one embodiment, the DCO gain normalization process determines the run-time scaling factor, $K_{scale}$ that may be applied to the PLL loop filter gain constants, $K_i$ and $K_p$, to map them to a nominal or expected DCO gain that was used to calculate the unmodified $K_i$ and $K_p$ values. This mapping of the run-time constants to the nominal gain eliminates or significantly reduces the gain variation associated with PVT (process, voltage, and temperature). The DCO gain normalization may be simplified based upon the following assumptions:

i) The nominal and measured gain curves are linear, or approximately linear.

ii) Being within a predefined percentage of error is acceptable.

iii) That the minimum counter value for all gain curves corresponds to a zero frequency value, and can be approximated to being the same without a significant loss in accuracy.

Figure 3:
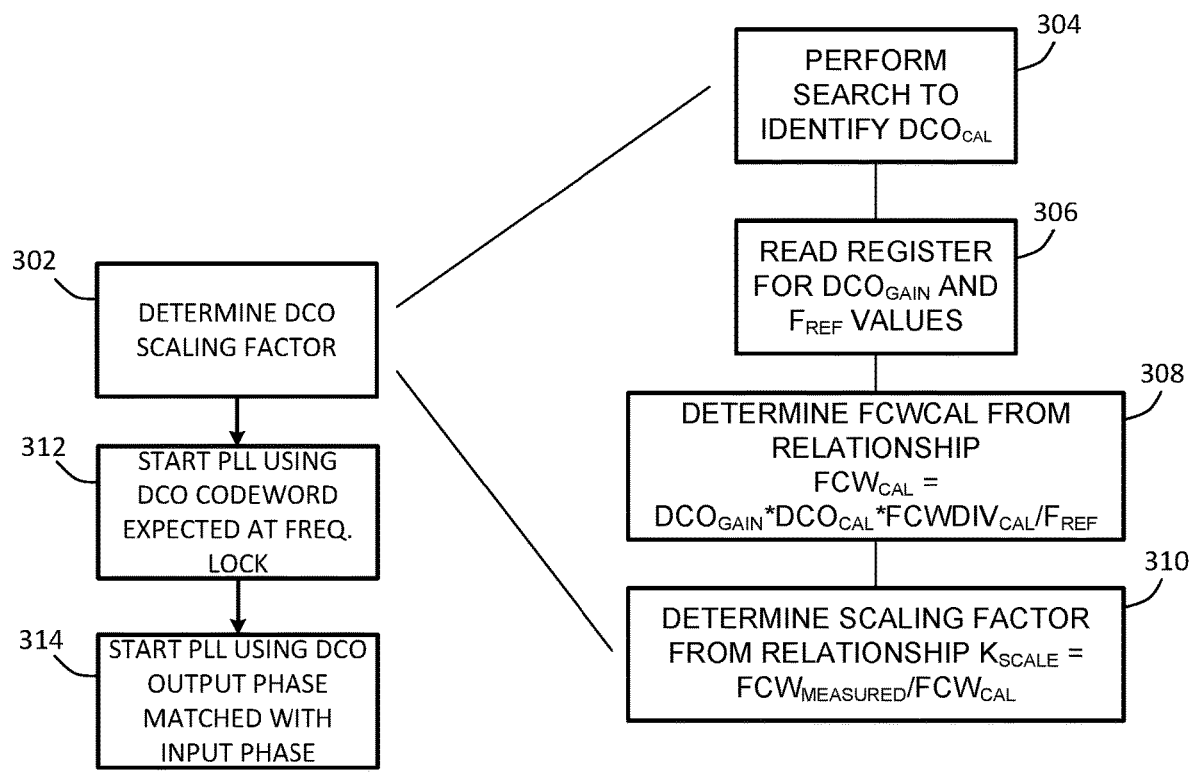
FIG. 3 illustrates a flowchart of steps illustrating one embodiment of a method of operating a PLL such as that shown in FIG. 1.

FIG. 3 illustrates steps employed in one embodiment of a method for determining a DCO scaling factor in a DCO gain normalization process, at 302. The DCO gain normalization process may be carried out during an initialization or calibration mode of operation and generally involves first determining an optimal DCO calibration codeword $DCO_{cal}$, at 304. For one embodiment, determining $DCO_{cal}$ involves carrying out a search routine, such as a modified binary search, to look for a selectable DCO codeword value that produces the closest output frequency to the desired output frequency. This is referred to as the "operating point" on the DCO gain curve. To prevent generating DCO frequencies that are out of the operational range of the circuit, PVT variations should be accounted-for when choosing the $DCO_{cal}$ value. One embodiment provides for up to 8× PVT variation in the DCO gain range. The calibration logic 122 (FIG. 1) assumes that the PLL circuit has closed timing at the FCW value specified at run-time, or is an operationally safe value. The $DCO_{cal}$ value is iteratively set and then checked to see if an associated frequency control word $FCW_{measured}$ value is less than a FCW value specified at run-time. This tells us that we are driving the DCO and therefore the DCO clock at close to the expected frequency for the application, but not exceeding the application frequency and therefore are not generating unexpected timing violations. This search function determines the DCO codeword value that we used during calibration, $DCO_{cal}$.

Once the DCO operating point has been determined, at 304 (FIG. 3), then steps to determine the scaling factor Kscale may be carried out. In order to understand the relationship between the DCO operating point and the scaling factor Kscale, a few theoretical relationships should first be pointed out. To begin with, the gain curves described above with respect to FIG. 2 generally relate to measured versus expected ratios between the counter circuits 108, 110. More specifically, the counter value generated by the PLL output counter 110 (FIG. 1) in the TDC 102 may be sampled on successive reference clock cycles to indicate DCO gain. The number of cycles that the counter has advanced in a single reference clock cycle tells us the frequency of the DCO output clock relative to the reference clock. By comparing this counter value to the nominal, i.e. expected, counter value, the gain of the DCO may be inferred and thereby normalized relative to the nominal DCO gain. In an open loop mode, the counter value "count" is constant and is equal to:

count=output frequency/input frequency (e.g. 4 GHz/ 25 MHz=160)

where: "output frequency" is the frequency of the PLL output signal, and "input frequency" is the frequency of the reference clock signal.
Or equivalently:

count=DCO gain*DCO/input frequency

Further, the count value may be viewed as equivalent to a frequency control word, FCW, that is used in a closed loop mode. The FCW is often defined by a setting in the DCO register, such as at 120, whereas during calibration the FCW is determined by the DCO setting. As a result, the relationship above becomes:

$$FCW_{cal}=DCOgain_{nom}*DCO_{cal}/input\ frequency \quad (1)$$

The nomenclature "FCW" instead of "counter" is thus used in the following discussion for clarity purposes, especially in a context involving frequency acquisition, more fully discussed below. Additionally, the input frequency may be represented as $F_{ref}/FCWDIV_{cal}$, where $FCWDIV_{cal}$ defines the external frequency division value that divides down the input reference frequency. The relationship then becomes:

$$FCW_{cal}=DCOgain_{nom}*DCO_{cal}*FCWDIV_{cal}F_{ref}$$

In the above equation, all variables are known except for $DCOgain_{nom}/F_{ref}$ which is used to perform the calibration, so it may be supplied by a run-time register variable stored in, for example, the register storage 120. This may be carried out in step 306 of FIG. 3. Once the variable values are provided, then the value of $FCW_{cal}$ can be determined, at step 308.

After determining an optimal DCO calibration codeword, and utilizing the calibration setting, the $FCW_{cal}$ value is measured to match the nominal gain based upon equation (1) above. However, due to the PVT variation, a different counter value is measured, called $FCW_{measured}$. The $K_{scale}$ variable may then be determined, at step 310 of FIG. 3, via the relationship:

$$K_{scale}=FCW_{measured}/FCW_{cal}$$

A straightforward lookup table stored in storage 118 may be employed for the 1/X relationship exhibited by the above equation, while other implementations for 1/X may be logic based. Note that the $K_{scale}$ variable is specific to the DCO gain in the system, so even if the FCWDIV variable is changed, the $K_{scale}$ value does not change.

For one embodiment, to minimize the PLL lock time, the approximate DCO codeword is determined when the PLL is locked, represented by the variable $DCO_{acq}$, and the output DCO clock phase is set to match the input phase. The DCO setting for frequency acquisition is calculated by scaling the DCO codeword setting that was found in normalization. The scaling accounts for the PVT variation, $K_{scale}$, and the different operating frequency defined by the variable $FCW_{acq}$. The DCO acquisition value may be determined via the following relationship:

$$DCO_{acq}=1/K_{scale}*FCW_{acq}/FCW_{cal}*FCWDIV_{cal}/FCWDIV_{acq}*DCO_{cal}$$

By using the same FCWDIV value for both the calibration and acquisition and substituting for $K_{scale}$, the following expression may be derived:

$$DCO_{acq}=FCW_{cal}/FCW_{measured}*FCW_{acq}/FCW_{cal}*DCO_{cal}$$

Which simplifies to:

$$DCO_{acq}=FCW_{acq}/FCW_{measured}*DCO_{cal}$$

In the above equation, $FCW_{acq}$ is the user's operational FCW value, so this is a straightforward calculation but requires the same 1/X calculation that was used previously.

Generally, in most cases, a user will calibrate with the same FCWDIV as during the frequency acquisition. If this is not the case, then an additional scale factor should be added during frequency acquisition to account for the change in FCWDIV:

$$DIV_{scale}=FCWDIV_{cal}/FCWDIV_{acq}$$

Using this additional scale factor, we get:

$$DCO'_{acq}=DIV_{scale}*DCO_{acq}$$

For one embodiment, and with continued reference to FIG. 3, to achieve ultra-fast PLL lock, the PLL loop-filter is set with both a frequency and phase that are very close to the locked frequency and phase. To minimize the initial phase error, the initial phase of the DCO is set to the same phase, or approximately the same phase, as the input clock reference signal. The DCO phase counter is set to match the phase of the input reference clock signal. Since the DCO counter value is literally set to match, or close to matching, the input reference clock signal phase, there is almost no phase locking required by the PLL. By calculating the DCO acquisition codeword, and by setting the DCO counter phase, the PLL may be started in an "almost locked" state which greatly reduces the PLL lock time.

As explained above, the approximate locked PLL frequency is pre-determined and used to start the PLL, at 312, and the DCO started at an almost zero phase error relative to the reference clock, at 314. Mechanically, this means that we set the DCO codeword to $DCO_{acq}$ and set the DCO phase to match the phase of the reference clock. Simulations indicate that we can lock in less than 30 reference clock cycles, whereas without this acquisition logic the lock time is approximately 90 reference clock cycles with our digital implementation. Most other PLL design implementations lock in many hundreds of clock cycles.

In a further embodiment, an alternative DCO gain normalization process may be carried out that has added flexibility over the embodiments described above. Specifically, the following discussion describes a DCO gain normalization process that may be accomplished even if a DCO codeword of "zero" corresponds to a frequency other than zero.

Figure 4:
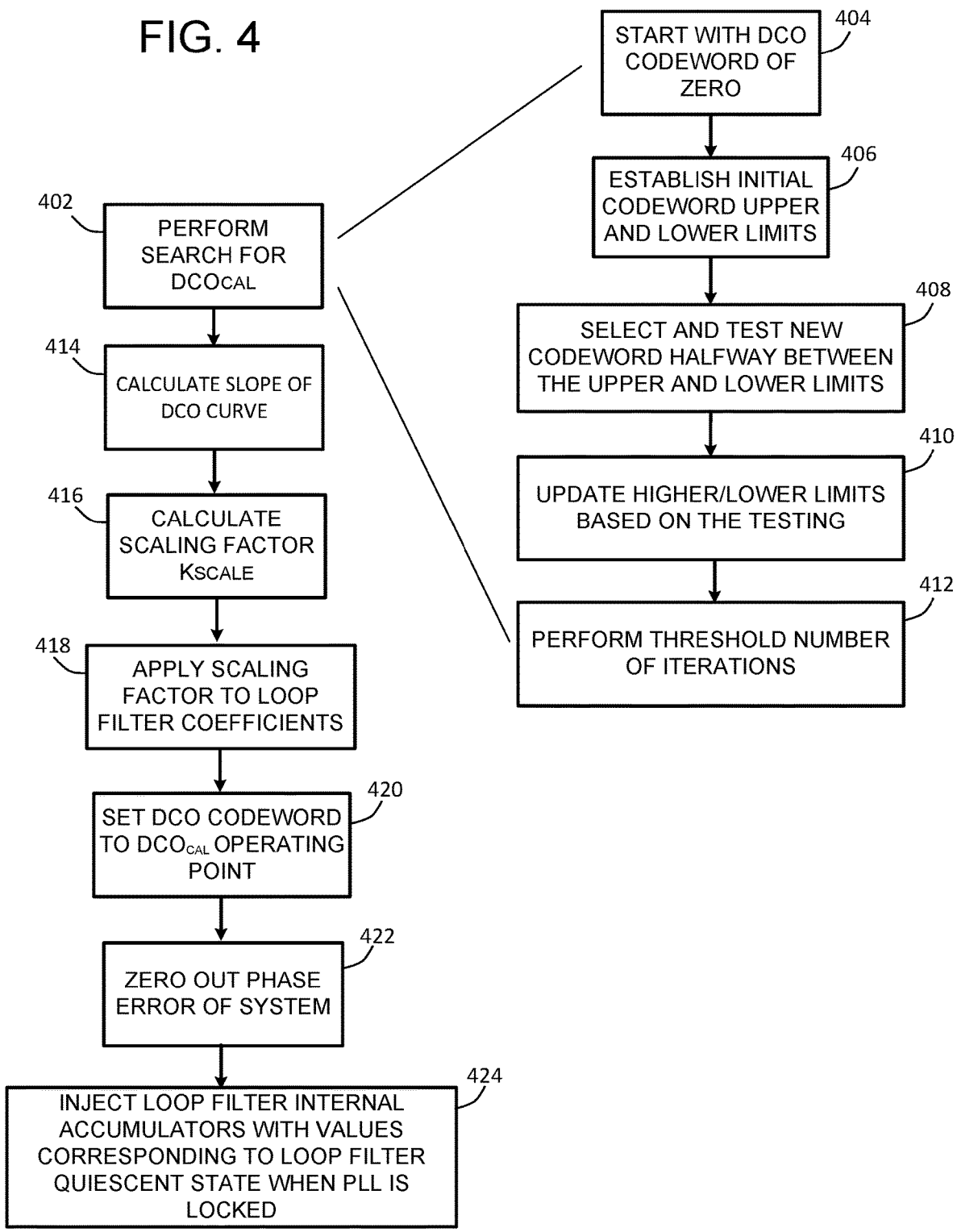
FIG. 4 illustrates a flowchart of steps illustrating an embodiment of an ultrafast locking method utilizing the PLL of FIG. 1.

Referring now to FIG. 4, a method of normalizing DCO gain involves first finding the optimal operating point on the DCO frequency curve, at 402. For one embodiment, the optimal operating point is the DCO codeword value that produces the closest output frequency to the desired output frequency. This may be found by a hardware state machine through an iterative search similar to that described above.

Alternatively, and further referring to FIG. 4, the search may involve starting with a DCO codeword value of "0", at 404, and stepping up the frequency in small step sizes to ensure that it does not cause timing violations as it moves to the next higher frequency. Initially, the small step sizes are used to establish initial codeword upper and lower limits, at 406. At each step, the method determines if the output counter running on the DCO clock is faster or slower than the expected DCO code. If it is slower, then it marks the current DCO code value as a "lower limit", and checks a DCO code value higher than the current DCO code. If it is faster, then it marks the current DCO code value as an "upper limit", and checks a DCO code value lower than the current DCO code. Once the "upper limit" has been found, the method tests a new DCO codeword that is half-way between the current "lower-limit" and the current "upper limit", at 408. Depending on whether the resulting frequency is faster or slower than the expected frequency, the upper and lower limits are updated, at 410. For one embodiment, the "halfway" code selection, testing, and limit updating steps are iterated, at 412, until the higher limit and lower limit reside on each side of a remaining codeword, thus identifying the DCO codeword operating point $DCO_{CAL}$. For other embodiments, the number of iterations may be constrained by a threshold number to balance speed versus accuracy.

For some embodiments, when performing the binary search, the state machine assumes that a higher DCO codeword corresponds to a higher output frequency. If it ever finds that a higher frequency causes a lower DCO count value, then it assumes that this is due to a timing violation and it stops the search and uses the previously valid "lower limit" value.

Once the operating point is determined, a slope of the DCO curve at the operating point is calculated. This represents the gain of the DCO at the operating point. The gain is the change in the DCO output frequency for each step in the DCO code. For one embodiment, this involves selecting a DCO codeword value that is "N" DCO codeword values away from the operating point, and driving the DCO with the offset codeword value. This is done to increase the difference in counts and to average the slope of the curve through a wider portion of the gain curve. The count value for the frequency associated with the offset codeword value is then determined, and the slope "$m_{actual}$" determined, at 414, by the following relationship:

$$m_{actual} = (count_{op} - count_{offset})/(\text{offsett} \cdot clkref_{cycles})$$

where: $count_{op}$ is the number of DCO counts at the operating point frequency, $count_{offset}$ is the number of DCO counts at the DCO code that is offset from the operating point frequency, offset is the difference in the DCO codeword values at the operating point and the offset, and $clkref_{cycles}$ is the number of clkref cycles over which the DCO counter runs.

For one embodiment, in order to measure the frequency of the DCO at each code, the processing circuitry of the loop filter measures the number of DCO counts that have occurred in a given number of "m" reference clock cycles. In one specific embodiment, the processing circuitry may average the number of counts running on the oscillator clock over sixteen reference clock cycles. The number of counts thus measures how far a counter running on the DCO clock has advanced during the m reference cycles, and accounts for wrap-around in the counter running on the DCO clock.

Once the slope of the actual frequency curve has been calculated, the scaling factor $k_{scale}$ may then be calculated, at 416, by taking the ratio of $m_{nominal}$ to $m_{actual}$, where $m_{nominal}$ is the ratio of the DCO frequency change to the change in DCO codeword, and represents the difference in the number of DCO counts that should occur per DCO codeword difference, in other words, the slope of the DCO frequency curve. In specific implementations, the value for $m_{nominal}$ is a fixed point number with fractional precision as defined by system parameters. In general, the greater the slope of the true frequency curve as compared to the nominal curve, the smaller the scaling factor $k_{scale}$.

Once the scaling factor is determined, it may then be applied to the loop filter control coefficients Ki and Kp, at 418, to generate normalized loop filter coefficients as substitutes for the nominal ones. As noted above, the loop filter includes storage that allows for configurability or programmability of loop filter coefficients such as the integral and proportional coefficients Ki and Kp. The internal storage of the loop filter may also store a start value, derived from the calibration DCO control word determined from the above steps. The start value may correspond to the calibration DCO code word such that it matches the value to the codeword, or forms a fractional value of the DCO codeword, for example. Nominal values for the integral and proportional coefficients Ki and Kp may generally be programmed prior to the initialization process described above. By applying the scaling factor to those nominal values, scaled or calibrated values for Ki and Kp may be used as replacements for the nominal values, thereby normalizing the DCO gain for the PLL.

For some embodiments, the gain curve is only normalized in a region of the operating point. This reduces the time needed to perform the initialization process. Other embodiments may normalize the entire curve and store the normalized coefficient values and/or the $K_{SCALE}$ factor for future use. This would effectively map the curve and allow for quick locking when changing from one frequency to another.

Once the scaling factor has been calculated and applied to the loop filter coefficients, the PLL may be operated to go into a locked state almost immediately, in a similar manner as that described above. With continued reference to FIG. 4, the stored start value corresponding to the calibration DCO codeword value (the DCOcal operating point) is fed into the loop filter, at 420. The loop filter is then started in an initial state where the phase-error (typically associated with an operating PLL) is zeroed out of the system, at 422. This may be accomplished by forcing the loop filter into an initial state where its phase is matched to the phase of the oscillator. This forces a phase lock between the DCO counter and the reference counter in the loop filter. The internal accumulators and registers, of the loop filter are then injected with values that are close to quiescent values exhibited while the PLL is in a locked state, at 424.

By locking the PLL in this manner, the control loop is effectively locked immediately since the correct frequency has been selected via the calibration DCO control word found during normalization, and the phase error is forcibly reduced close to zero. In addition, by starting the control loop close to its quiescent state, it does not require time to ramp up to the point at which the internal loop filter accumulators contain their steady-state values (the quiescent state). Setting the internal loop filter phase to match the output clock phase allows for zeroing out of the phase error, while also not altering the phase of the output clock generated by the oscillator. In this way, a jump to a locked state may be accomplished without changing the phase of the output clock.

Figure 5:
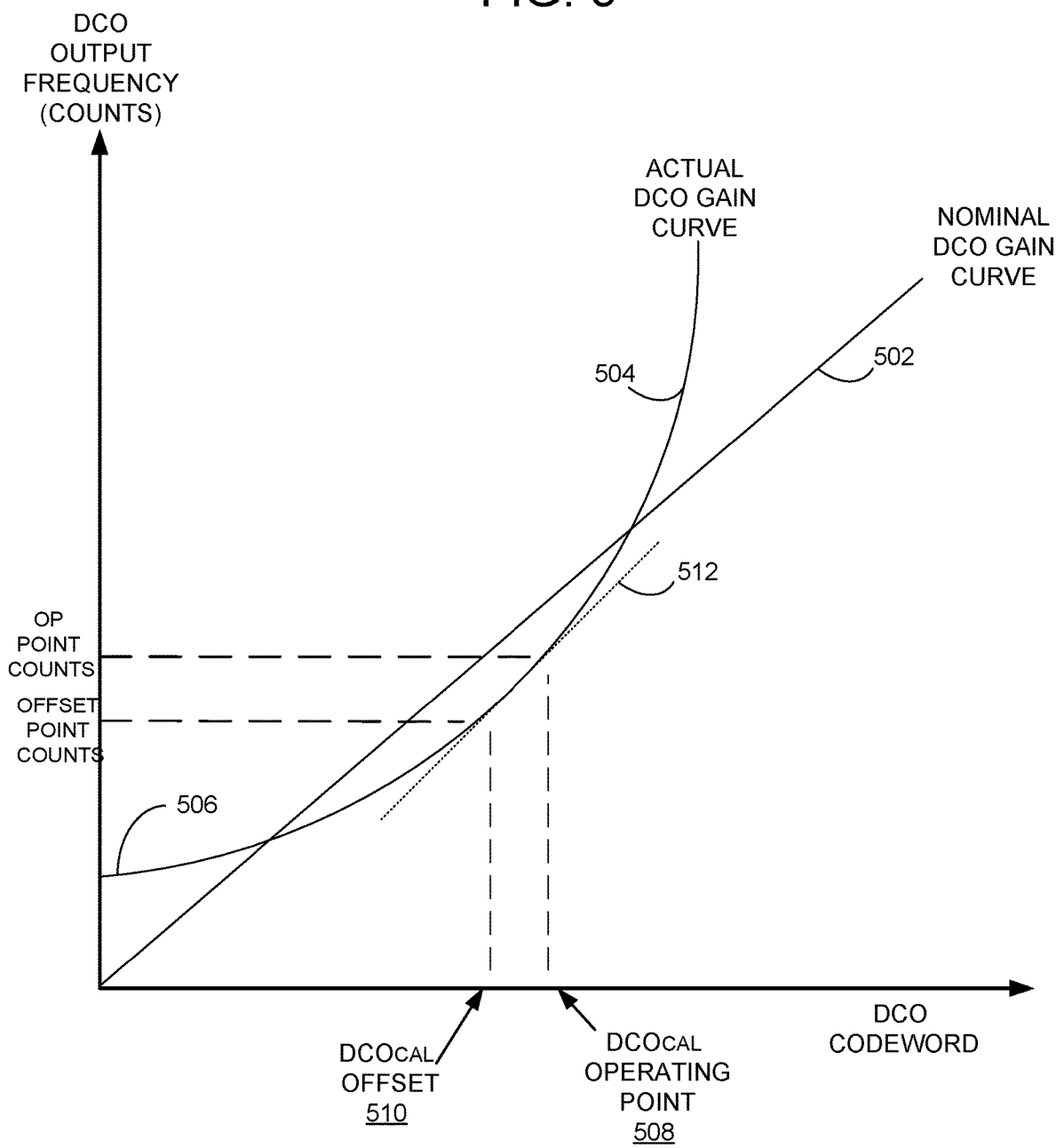
FIG. 5 illustrates actual and measured curves that plot DCO codeword values versus DCO frequency/count values.

FIG. 5 illustrates a graphical representation of various points and curves associated with the DCO normalization process described above with respect to FIG. 4. The X-axis of the curve represents DCO codeword values, while the Y-axis represents the DCO output frequency in terms of counts (such as counted by counter 110 of FIG. 1, during a given time interval). A nominal DCO gain curve, at 502, is overlaid on an actual DCO gain curve, at 504. In many situations, a DCO control word specifying all zeros may correspond to a frequency other than zero, as shown at 506. Further, the actual DCO curve may exhibit a nonlinear relationship between DCO control values and frequency. The $DCO_{CAL}$ operating point is shown, at 508, with the "N" codeword steps resulting in an offset from the $DCO_{CAL}$ operating point shown at 510. The scaling factor, $K_{SCALE}$ is shown as the slope of the tangent to the actual DCO gain curve within the region defined by the $DCO_{CAL}$ operating point and the offset, at 512.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A method of operation in a locked-loop circuit, the locked-loop circuit including a loop filter and a digitally-controlled oscillator (DCO), the loop filter including a first input to receive a digital word representing a difference between a reference clock frequency and a DCO output frequency, the loop filter including internal storage, the method comprising:
    selecting a desired DCO output frequency, the DCO output frequency generated in response to a calibration DCO codeword, the calibration DCO codeword determinded from a calibration search process;
    retrieving a start value from the loop filter internal storage, the start value corresponding to the calibration DCO codeword; and
    starting the locked-loop circuit with the retrieved start value.

2. The method of claim 1, further comprising:
    phase-matching a phase of the loop filter with a phase of the DCO output frequency.

3. The method of claim 1, wherein the loop filter further includes programmable gain constant inputs for receiving an integral gain constant Ki, and a proportional gain constant Kp, and wherein the method further comprises:
    before starting the locked-loop circuit, programming calibrated values for Ki and Kp into the loop filter programmable gain constant inputs.

4. The method of claim 3, wherein the calibrated values are determined during a calibration process.

5. The method of claim 4, wherein the nominal values are scaled by a DCO gain scaling factor, the DCO gain scaling factor determined during the calibration process.

6. The method of claim 1, wherein the calibration DCO codeword is determined during a calibration process.

7. The method of claim 1, wherein the calibration DCO codeword comprises a DCO codeword value representing a frequency proximate the desired output frequency.

8. A locked-loop circuit, comprising:
    a phase comparison circuit having a reference clock input to receive a reference clock signal, a locked-loop input to receive a digitally-controlled oscillator (DCO) output signal, and an output to generate a digital word representing a frequency difference between the reference clock signal and the DCO output signal;
    a digital loop filter including input circuitry having a first input coupled to the phase comparison output to receive the digital word in a steady state mode of operation, the digital loop filter including internal storage for storing a start value for use during a start mode of operation, the start value corresponding to a calibration DCO codeword, the calibration DCO codeword determined from a calibration search process;
    a digitally-controlled oscillator (DCO) having an input coupled to the loop filter, and having an output to generate the DCO output signal in response to the calibration DCO codeword.

9. The locked-loop circuit according to claim 8, wherein the start value matches a phase of the loop filter to a phase of the DCO output signal.

10. The locked-loop circuit according to claim 8, wherein the loop filter further includes programmable gain constant inputs for receiving an integral gain constant Ki, and a proportional gain constant Kp, and wherein:
    during the start mode of operation, the programmable gain constant inputs are programmed with calibrated values for Ki and Kp.

11. The locked-loop circuit according to claim 10, wherein the calibrated values are determined during a calibration process.

12. The locked-loop circuit according to claim 11, wherein the nominal values for Ki and Kp are scaled by a DCO gain scaling factor, the DCO gain scaling factor determined during the calibration process.

13. The locked-loop circuit according to claim 8, wherein the calibration DCO codeword is determined during a calibration process.

14. The locked-loop circuit according to claim 8, wherein the calibration DCO codeword comprises a DCO codeword value corresponding to a frequency proximate the desired output frequency.

15. A loop filter circuit for use in a locked-loop circuit, comprising:
    input circuitry having a first input coupled to a phase comparison circuit to receive a digital word in a steady state mode of operation, the input circuitry including internal storage for storing a start value for use during a start mode of operation, the start value corresponding to a calibration digitally-controlled oscillator (DCO) codeword, the calibration DCO codeword determined from a calibration search process.

16. The loop filter circuit of claim 15, wherein the start value includes a phase value that matches a phase of a DCO output frequency.

17. The loop filter circuit of claim 15, wherein the input circuitry further comprises:
   programmable gain constant inputs for receiving an integral gain constant Ki, and a proportional gain constant Kp; and
   wherein during the start mode of operation, the programmable gain constant inputs are programmed with calibrated values for Ki and Kp.

18. The loop filter circuit of claim 17, wherein the calibrated values are predetermined during a calibration process.

19. The loop filter circuit of claim 18, wherein nominal values for Ki and Kp are scaled by a DCO gain scaling factor, the DCO gain scaling factor determined during the calibration process.

20. The loop filter circuit of claim 15, wherein the predetermined DCO codeword is determined during a calibration process.

* * * * *